United States Patent
Zhou et al.

(10) Patent No.: US 11,043,448 B2
(45) Date of Patent: Jun. 22, 2021

(54) SEMICONDUCTOR DEVICE WITH VERTICALLY SEPARATED OPENINGS AND MANUFACTURING METHOD THEREOF

(71) Applicant: WUHAN XINXIN SEMICONDUCTOR MANUFACTURING CO., LTD., Hubei (CN)

(72) Inventors: Yu Zhou, Hubei (CN); Tianjian Liu, Hubei (CN); Sheng Hu, Hubei (CN); Changlin Zhao, Hubei (CN); Xing Hu, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 79 days.

(21) Appl. No.: 16/397,130

(22) Filed: Apr. 29, 2019

(65) Prior Publication Data
US 2020/0075483 A1    Mar. 5, 2020

(30) Foreign Application Priority Data
Aug. 28, 2018  (CN) .......................... 201810990634.4

(51) Int. Cl.
*H01L 23/522* (2006.01)
*H01L 21/02* (2006.01)
(Continued)

(52) U.S. Cl.
CPC ...... *H01L 23/5226* (2013.01); *H01L 21/0217* (2013.01); *H01L 21/0274* (2013.01);
(Continued)

(58) Field of Classification Search
CPC ........... H01L 23/5226; H01L 21/02164; H01L 21/0217; H01L 21/0274; H01L 21/308;
(Continued)

(56) References Cited

U.S. PATENT DOCUMENTS

| | | | | |
|---|---|---|---|---|
| 2011/0233702 A1* | 9/2011 | Takahashi | ......... | H01L 27/14636 257/432 |
| 2012/0223437 A1* | 9/2012 | Heinrich | ............. | H01L 23/5222 257/774 |

(Continued)

FOREIGN PATENT DOCUMENTS

| | | |
|---|---|---|
| CN | 102201418 A | 9/2011 |
| CN | 102054849 A | 11/2011 |

(Continued)

*Primary Examiner* — Steven H Loke
*Assistant Examiner* — Juanita B Rhodes
(74) *Attorney, Agent, or Firm* — Muncy, Geissler, Olds & Lowe, P.C.

(57) ABSTRACT

A semiconductor device and a manufacturing method thereof are disclosed. In which a first opening and a second opening are vertically separated, and are no longer restricted by the condition that a deep upper opening needs to be filled with a thick photoresist when a TSV nested hole in vertical communication forms a middle opening and lower opening, thereby satisfying devices with different thicknesses requirements. The design is no longer restricted by the lateral process of the TSV nested hole, thereby enhancing the flexibility of the design. In the photolithography process, the deep hole does not need to be filled with the photoresist, the photoresist does not need to be thick, thereby reducing the complexity of the photolithography process and improving the exposure effect. The first metal layer and the second metal layer are directly led out via a first trench, thereby simplifying the process and reducing the production cost.

11 Claims, 9 Drawing Sheets

(51) Int. Cl.
*H01L 21/027* (2006.01)
*H01L 21/308* (2006.01)
*H01L 21/311* (2006.01)
*H01L 21/768* (2006.01)
*H01L 23/31* (2006.01)
*H01L 23/528* (2006.01)
*H01L 23/532* (2006.01)

(52) U.S. Cl.
CPC ...... *H01L 21/02164* (2013.01); *H01L 21/308* (2013.01); *H01L 21/31116* (2013.01); *H01L 21/31144* (2013.01); *H01L 21/76804* (2013.01); *H01L 21/76808* (2013.01); *H01L 21/76877* (2013.01); *H01L 23/3171* (2013.01); *H01L 23/5283* (2013.01); *H01L 23/53228* (2013.01)

(58) Field of Classification Search
CPC ......... H01L 21/31116; H01L 21/31144; H01L 21/76804; H01L 21/76808; H01L 21/76877; H01L 23/3171; H01L 23/5283; H01L 23/53228; H01L 23/481; H01L 21/76898; H01L 23/5384
See application file for complete search history.

(56) References Cited

U.S. PATENT DOCUMENTS

| | | | |
|---|---|---|---|
| 2014/0091414 A1* | 4/2014 | Shimotsusa | H01L 27/14636 257/431 |
| 2016/0284755 A1 | 9/2016 | Shimotsusa | |

FOREIGN PATENT DOCUMENTS

| | | |
|---|---|---|
| CN | 103797579 A | 5/2014 |
| CN | 104425357 A | 3/2015 |
| CN | 105470147 A | 4/2016 |
| TW | 201523855 A | 6/2015 |

\* cited by examiner

| Provide a first wafer and a second wafer that are bonded, wherein the first wafer includes a first substrate, a first dielectric layer located on a front surface of the first substrate and a first metal layer embedded in the first dielectric layer, the second wafer includes a second substrate, a second dielectric layer located on the second substrate and a second metal layer embedded in the second dielectric layer, and the first dielectric layer faces the second dielectric layer | S1 |

| Form a passivation layer, wherein the passivation layer is located on a back surface of the first substrate | S2 |

| Form a first groove, wherein the first groove penetrates through a portion of the passivation layer and is located above the first metal layer and the second metal layer | S3 |

| Form a first opening, wherein the first opening penetrates through the passivation layer, the first substrate and a portion of the first dielectric layer and is located above the first metal layer, and the first opening communicates with the first groove | S4 |

| Form a second opening, wherein the second opening penetrates through the first wafer and a portion of the second dielectric layer and is located above the second metal layer, and the second opening communicates with the first groove | S5 |

| Perform a dry etching process to expose the first metal layer below the first opening and the second metal layer below the second opening | S6 |

| Form an interconnection layer, wherein the interconnection layer is electrically connected to the first metal layer and the second metal layer through the first groove, the first opening and the second opening | S7 |

Fig. 7

SEMICONDUCTOR DEVICE WITH VERTICALLY SEPARATED OPENINGS AND MANUFACTURING METHOD THEREOF

CROSS-REFERENCE TO RELATED APPLICATION

This application claims the priority of Chinese patent application number 201810990634.4, filed on Aug. 28, 2018, the entire contents of which are incorporated herein by reference.

TECHNICAL FIELD

The present invention pertains to the technical field of integrated circuit manufacturing, and in particular, relates to a semiconductor device and a manufacturing method thereof.

BACKGROUND

TSV (Through Silicon Via) technology is a new technology for interconnecting chips by fabricating vertical conduction between a chip and a chip and between a wafer and a wafer, which enables a higher stack density in three dimensions.

In TSV technology, the upper and lower bonded wafers often use the TSV nested hole structure to realize the metal interconnection of the upper wafer and the lower wafer. The TSV nested opening includes an upper opening, a middle opening and a lower opening in vertical communication, wherein the lower opening is a deep hole. This TSV nested hole structure can largely solve the need for metal interconnection after bonding. However, the inventors have found that the limitations of this TSV nested hole structure in practical applications are also becoming increasingly prominent. On one hand, the TSV nested hole structure connects the metal layers of the upper and lower wafers through the TSV nested hole in vertical communication, and the metal layer distribution design of the upper and lower wafers is restricted by the lateral process of the TSV nested hole in vertical communication. For example, the lateral distance between the metal layers of the upper and lower wafers should not be too large. If the distance is too large, the effective area of the upper wafer is wasted. At the same time, as the aspect ratio of the deep hole increases, it is difficult to fill the deep hole with the filling layer, and it is also difficult to remove the filling layer from the deep hole.

On the other hand, when a wafer is used to manufacture a device having a certain thickness requirement, such as an image sensor, the thickness of the wafer substrate depends on the performance requirements of the image sensor. The wafer substrate has a large thickness to meet the performance requirements of the image sensor, so that the upper opening penetrating through the wafer substrate is deep. In the subsequent formation of the middle opening and the lower opening, it is necessary to fill the upper opening with a photoresist, which will inevitably result in a thicker photoresist for filling the upper opening. Due to the presence of the upper opening and the thicker photoresist, the surface of the photoresist is prone to unevenness, and the photolithography process is affected by the poor surface smoothness on the substrate sidewall exposed by the penetration of the upper opening and on the thick photoresist, resulting in poor exposure and even no exposure.

SUMMARY OF THE INVENTION

An objective of the present invention is to provide a manufacturing method of a semiconductor device and a semiconductor device, which can solve the problem of low flexibility of a wafer in the design of the existing TSV nested hole structure, and the problem of the increase in difficulty of the process with the increase of the aspect ratio of the deep hole.

Another objective of the present invention is to improve the exposure effect.

In order to solve the above technical problems, the present invention provides a manufacturing method of a semiconductor device, including:

providing a first wafer and a second wafer that are bonded, wherein the first wafer includes a first substrate, a first dielectric layer located on a front surface of the first substrate and a first metal layer embedded in the first dielectric layer, the second wafer includes a second substrate, a second dielectric layer located on the second substrate and a second metal layer embedded in the second dielectric layer, and the first dielectric layer faces the second dielectric layer;

forming a passivation layer, wherein the passivation layer is located on a back surface of the first substrate;

forming a first trench, wherein the first trench penetrates through a portion of the passivation layer and is located above the first metal layer and the second metal layer;

forming a first opening, wherein the first opening penetrates through the passivation layer, the first substrate and a portion of the first dielectric layer and is located above the first metal layer, and the first opening communicates with the first trench;

forming a second opening, wherein the second opening penetrates through the first wafer and a portion of the second dielectric layer and is located above the second metal layer, and the second opening communicates with the first trench;

performing a dry etching process to expose the first metal layer below the first opening and the second metal layer below the second opening; and forming an interconnection layer, wherein the interconnection layer is electrically connected to the first metal layer and the second metal layer via the first trench, the first opening and the second opening.

The present invention further provides a semiconductor device, including:

a first wafer and a second wafer, wherein the first wafer includes a first substrate, a first dielectric layer located on a front surface of the first substrate and a first metal layer embedded in the first dielectric layer; the second wafer includes a second substrate, a second dielectric layer located on the second substrate and a second metal layer embedded in the second dielectric layer, and the first dielectric layer faces the second dielectric layer;

a passivation layer, wherein the passivation layer is located on a back surface of the first substrate;

a first trench, wherein the first trench penetrates through a portion of the passivation layer and is located above the first metal layer and the second metal layer;

a first opening, wherein the first opening penetrates through the passivation layer, the first substrate and a portion of the first dielectric layer and is located above the first metal layer, and the first opening communicates with the first trench;

a second opening, wherein the second opening penetrates through the first wafer and a portion of the second dielectric layer and is located above the second metal layer, and the second opening communicates with the first trench; and an interconnection layer, wherein the interconnection layer is electrically connected to the first metal layer and the second metal layer via the first trench, the first opening and the second opening.

According to the semiconductor device provided by the present invention, the first opening penetrates through the passivation layer, the first substrate and a portion of the first dielectric layer and is located above the first metal layer; the second opening penetrates through the first wafer and a portion of the second dielectric layer and is located above the second metal layer; the first opening and the second opening do not communicate with each other, that is, the first opening and the second opening are vertically separated, and are no longer restricted by the condition that the deep upper opening needs to be filled with a thick photoresist when the TSV nested hole in vertical communication forms the following middle opening and lower opening, thereby satisfying devices with different thicknesses requirements. Meanwhile, the metal layer distribution design of the upper and lower wafers is no longer restricted by the lateral process of the TSV nested hole, thereby enhancing the flexibility of the wafer design.

Further, in the present invention, the filling layer is used to fill the first opening (the first opening is a shallow opening), thereby solving the problems that it is difficult to fill the lower opening deep hole with the filling layer and it is also difficult to remove the filling layer from the deep hole.

Further, the first trench is filled with the first photoresist layer, and the first photoresist layer covers the surface of the passivation layer; the second photoresist layer covers the surfaces of the passivation layer and the filling layer; in the photolithography process, the deep hole does not need to be filled with the photoresist, and the photoresist does not need to be thick, thereby reducing the complexity of the photolithography process and improving the exposure effect.

Besides, the interconnection layer is electrically connected to the first metal layer and the second metal layer via the first trench, the first opening and the second opening, and the first metal layer and the second metal layer are directly led out via the first trench, so there is no need for the lead-out process of forming an insulating layer and a contact hole in the insulating layer and electrically connecting the lead-out layer to the interconnection layer via the contact hole, thereby simplifying the process and reducing the production cost.

BRIEF DESCRIPTION OF THE DRAWINGS

FIG. 7 is a flow diagram of a manufacturing method of a semiconductor device according to an embodiment of the present invention;

The reference signs are as follows:
01—wafer; 02—photoresist; 03—lens; 04—focal plane;
10—upper wafer;
101—first substrate; 102—first dielectric layer; 103—first metal layer; 104—first etching stopping layer; 105—passivation layer; 106—interconnection layer;
20—lower wafer;
201—second substrate; 202—second dielectric layer; 203—second metal layer; 204—passivation layer;
30—bonding interface;
41a—upper opening; 41b—middle opening; 41c—lower opening;
50—first wafer;
501—first substrate; 502—first dielectric layer; 503—first metal layer; 504—first etching stopping layer; 505—passivation layer; 502a—first dielectric layer first portion; 502b—first dielectric layer second portion; 506—isolation layer; 507—interconnection layer;
60—second wafer;
601—second substrate; 602—second dielectric layer; 603—second metal layer; 604—second etching stopping layer; 605—passivation layer; 602a—second dielectric layer first portion; 602b—second dielectric layer second portion;
70—bonding interface;
81a—first trench; 81b—first opening; 81c—second opening;
91—first photoresist layer; 92—filling layer; 93—second photoresist layer.

DETAILED DESCRIPTION OF THE INVENTION

As described in the background, the current TSV nested hole structure has limitations in realizing metal interconnection in practical applications. On one hand, the TSV nested hole structure connects the metal layers of the upper and lower wafers via the TSV nested hole in vertical communication, and the metal layer distribution design of the upper and lower wafers is restricted by the lateral process of the TSV nested hole in vertical communication. At the same time, as the aspect ratio of the deep hole increases, it is difficult to fill the deep hole with the filling layer and it is also difficult to remove the filling layer from the deep hole.

On the other hand, when a wafer is used to manufacture a device having a certain thickness requirement, the TSV nested hole in vertical communication needs to fill the deep upper opening with a thick photoresist in order to form the following middle opening and lower opening. The photolithography process is affected by the poor surface smoothness on the substrate sidewall exposed by the penetration of the upper opening and on the thick photoresist, resulting in poor exposure and even no exposure.

Figure 1:
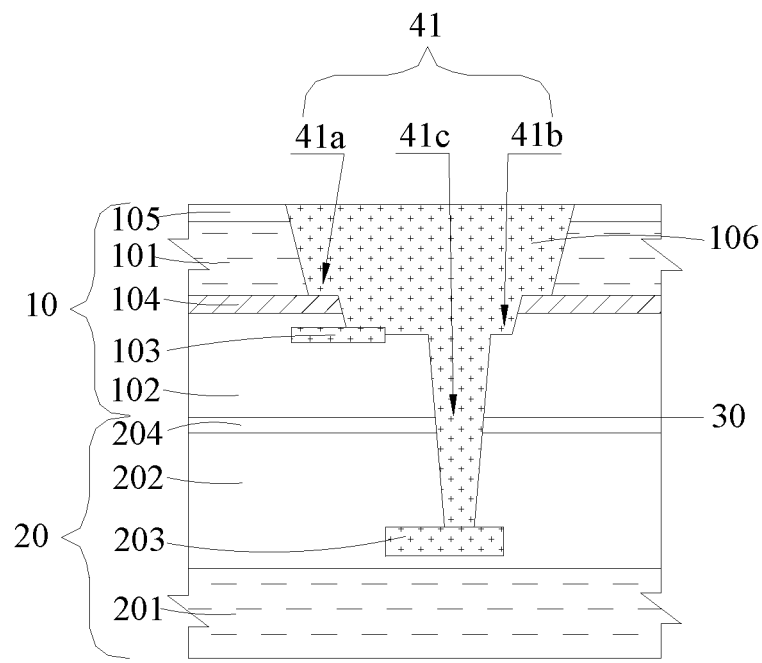
FIG. 1 is a schematic cross-sectional view of a semiconductor device having a TSV nested hole structure.

Specifically, a semiconductor device having a TSV nested hole structure, as shown in FIG. 1, includes:

an upper wafer 10 and a lower wafer 20 that are bonded, wherein the upper wafer 10 includes a first substrate 101, a first dielectric layer 102 located on a front surface of the first substrate 101 and a first metal layer 103 embedded in the first dielectric layer 102. The lower wafer 20 includes a second substrate 201, a second dielectric layer 202 located on the second substrate 201 and a second metal layer 203 embedded in the second dielectric layer 202. The first dielectric layer 102 faces the second dielectric layer 202 to form a bonding interface 30; and a TSV nested hole 41, wherein the TSV nested hole 41 includes an upper opening 41a, a middle opening 41b and a lower opening 41c. The upper opening 41a penetrates through the passivation layer 105 and the first substrate 101 and is located above the first metal layer 103. The lower opening 41c penetrates through the first wafer 10 and a portion of the second dielectric layer 202 and exposes a portion surface of the second metal layer 203. The middle opening 41b is located between the upper opening 41a and the lower opening 41c and communicates with the upper opening 41a and the lower opening 41c, and the middle opening 41b exposes a portion of the first metal layer 103. An interconnection layer 106 is formed in the TSV nested hole 41, and the interconnection layer 106 is electrically connected to the first metal layer 103 and the second metal layer 203.

Further, the upper wafer 10 further includes a first etching stopping layer 104, wherein the first etching stopping layer 104 is located between the first substrate 101 and the first dielectric layer 102. The upper wafer 10 further includes a passivation layer 105 located on a back surface of the first substrate 101. The lower wafer 20 further includes a passivation layer 204 located on the second dielectric layer 202.

A manufacturing method of a semiconductor device having a TSV nested hole structure will be described below with reference to FIG. 2 to FIG. 5.

Figure 2:
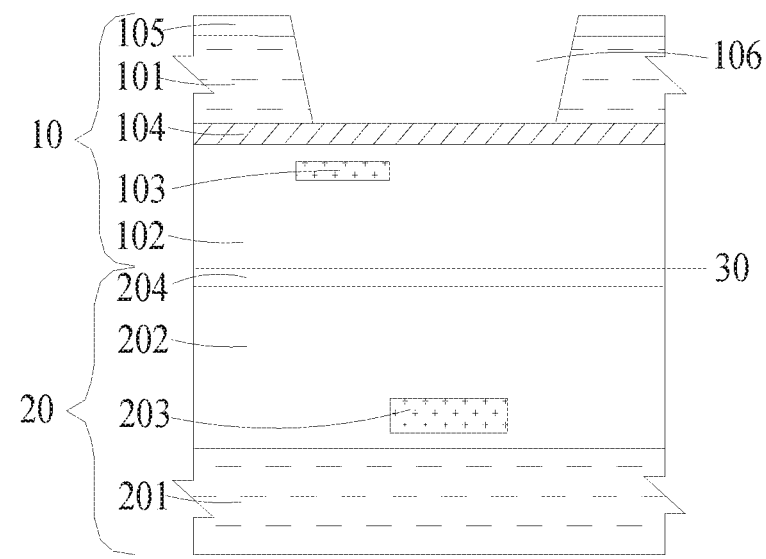
FIG. 2 is a schematic cross-sectional view after an upper opening is formed in a manufacturing method of a semiconductor device having a TSV nested hole structure.

As shown in FIG. 2, a photolithography and etching process is performed to form an upper opening 41a. The etching process terminates at the first etching stopping layer 104, and the upper opening 41a penetrates through the passivation layer 105 and the first substrate 101 and is located above the first metal layer 103.

Figure 3:
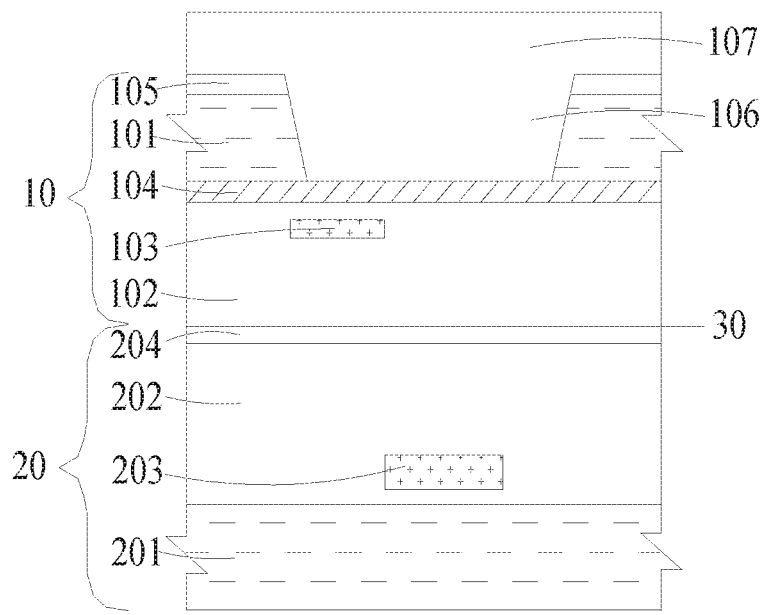
FIG. 3 is a schematic cross-sectional view after a photoresist is formed in a manufacturing method of a semiconductor device having a TSV nested hole structure.

Next, as shown in FIG. 3, a photoresist 107 is formed. The upper opening 41a is filled with the photoresist 107, and the photoresist 107 covers the surface of the passivation layer 105.

Figure 4:
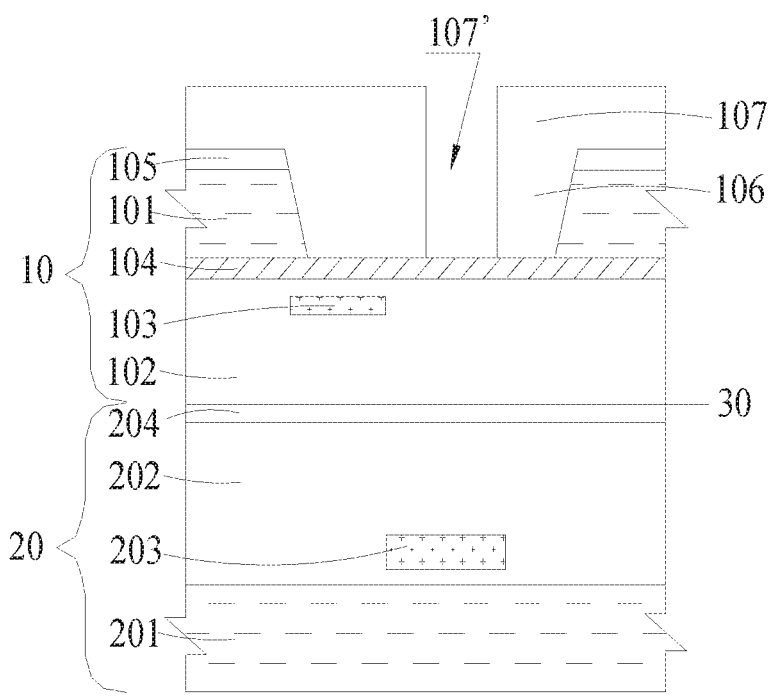
FIG. 4 is a schematic cross-sectional view after the photoresist is exposed and developed in a manufacturing method of a semiconductor device having a TSV nested hole structure.

Next, as shown in FIG. 4, the photoresist 107 is exposed and developed. A photoresist opening 107' located above the first metal layer 103 is formed by exposure and development.

Figure 5:
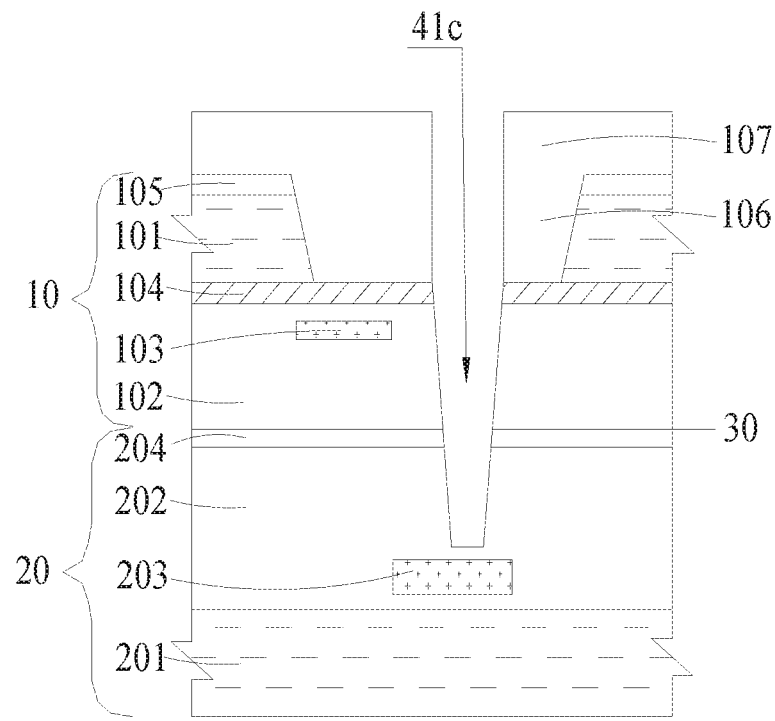
FIG. 5 is a schematic cross-sectional view after a lower opening is formed in a manufacturing method of a semiconductor device having a TSV nested hole structure.

Next, as shown in FIG. 5, a lower opening 41c is formed. By using the remaining photoresist 107 as a mask, a lower opening 41c is formed by etching. The lower opening 41c penetrates through the first wafer 10 and a portion of the second dielectric layer 202 and exposes the second metal layer 203 in a subsequent process. The lower opening 41c communicates with the upper opening 41a.

Next, in the subsequent formation of the middle opening 41b, the lower opening 41c is first filled with the filling layer, and then the upper opening 41a is filled with the photoresist. As the aspect ratio of the lower opening 41c (deep hole) increases, it is difficult to fill the deep hole with the filling layer and it is also difficult to remove the filling layer from the deep hole.

Figure 6:
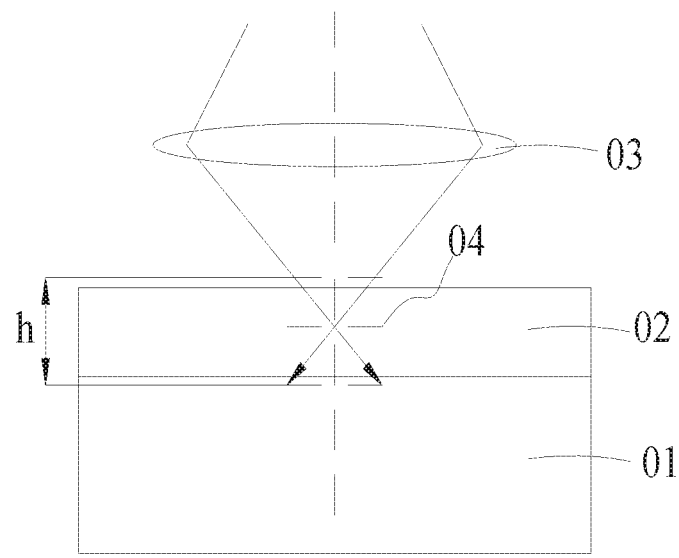
FIG. 6 is a schematic view of a photolithography process.

In addition, for the sake of understanding later, as shown in FIG. 6, the lithography process will be briefly introduced.

A photoresist 02 is formed on a wafer 01. And a lens 03, a photomask (not shown) and an illumination device are sequentially arranged above the photoresist 02. During photolithography, the ultraviolet light emitted by the illumination device passes through the photomask and reaches the lens 03, and the light is focused on the photoresist 02. The convergence point of the light is the focus, the focus is the point where the best image appears along the center of the lens, the plane of the focus is the focal plane 04, the depth of focus (DOF) is a range h between the top and bottom of the focus, and the image remains continuously clear in this range h.

In the photolithography process, the focus may not be exactly at the center of the photoresist 02, but the depth of focus (DOF) should pass through the upper and lower surfaces of the photoresist 02, so as to ensure that the entire thickness of the photoresist 02 in the exposure range is clearly imaged.

FIG. 3 to FIG. 4 above are ideal states of exposure and development in a photolithography process in a manufacturing method of a semiconductor device having a TSV nested hole structure.

However, the inventors have found that in the actual process, when the upper wafer 10 is used to manufacture a device having a certain thickness, such as an image sensor, the thickness of the first substrate 101 depends on the performance requirements of the image sensor, and is usually 2.1-3.0 μm. Thus, the depth of the upper opening 41a is at least 2.1 μm. In the photolithography process of forming the lower opening 41c in FIG. 3 to FIG. 5, since the first substrate 101 is larger in thickness in order to satisfy the performance requirements of the image sensor, the upper opening 41a penetrating through the first substrate 101 is deeper, so the photoresist 107 with which the upper opening 41a is filled and which covers the passivation layer 105 is thicker, and thus, the photolithography process is affected by the sidewall of the first substrate 101 and the photoresist 107. In one aspect, the sidewall of the first substrate 101 affects the optical path. In another aspect, the surface smoothness of the thicker photoresist 107 is poor, resulting in a smaller depth of focus (DOF) and process window. During the focusing process, two problems resulting in poor exposure are encountered: the focal plane moves up and the photoresist remains at the bottom; the focal plane moves down, and the photoresist residue is alleviated, but the bottom photoresist is inscribed. In still another aspect, when the image sensor is thick to a certain extent and the thickness of the photoresist 107 may exceed the maximum depth of focus (DOF) available to the photolithography system, the photolithography system will not be able to expose the photoresist 107 of that thickness.

Based on the above research, an embodiment of the present invention provides a manufacturing method of a semiconductor device, as shown in FIG. 7, including the following steps:

S1: providing a first wafer and a second wafer that are bonded, wherein the first wafer includes a first substrate, a first dielectric layer located on a front surface of the first substrate and a first metal layer embedded in the first dielectric layer, the second wafer includes a second substrate, a second dielectric layer located on the second substrate and a second metal layer embedded in the second dielectric layer, and the first dielectric layer faces the second dielectric layer;

S2: forming a passivation layer, wherein the passivation layer is located on a back surface of the first substrate;

S3: forming a first trench, wherein the first trench penetrates through a portion of the passivation layer and is located above the first metal layer and the second metal layer;

S4: forming a first opening, wherein the first opening penetrates through the passivation layer, the first substrate and a portion of the first dielectric layer and is located above the first metal layer, and the first opening communicates with the first trench;

S5: forming a second opening, wherein the second opening penetrates through the first wafer and a portion of the second dielectric layer and is located above the second metal layer, and the second opening communicates with the first trench;

S6: performing a dry etching process to expose the first metal layer below the first opening and the second metal layer below the second opening; and S7: forming an interconnection layer, wherein the interconnection layer is electrically connected to the first metal layer and the second metal layer via the first trench, the first opening and the second opening.

The present invention will be further described in detail below with reference to the drawings and specific embodiments. Advantages and features of the present invention will become more apparent from the description. It should be noted that the drawings are in a very simplified form and are used in a non-precise scale, and are merely for convenience and clarity of the purpose of the embodiments of the present invention.

The manufacturing method of a semiconductor device provided by the embodiment of the present invention is described in detail below with reference to FIG. 8 to FIG. 15.

Figure 8:
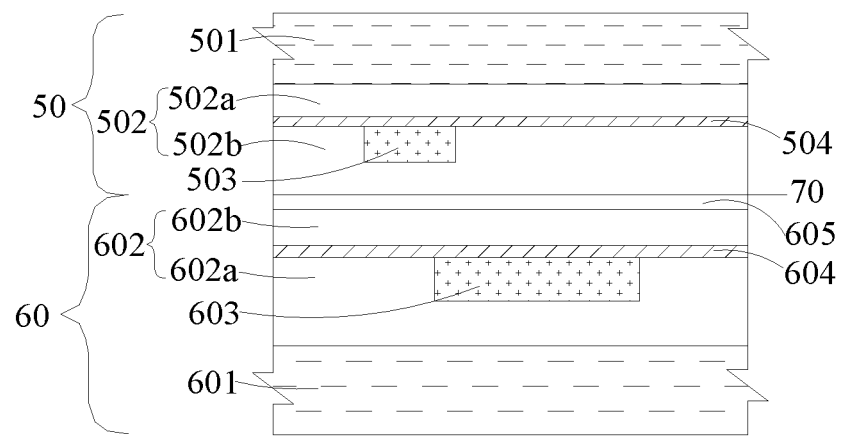
FIG. 8 is a schematic view after two wafers are bonded according to an embodiment of the present invention.

First, as shown in FIG. 8, a first wafer 50 and a second wafer 60 that are bonded are provided. The first wafer 50 includes a first substrate 501, a first dielectric layer 502 located on a front surface of the first substrate 501 and a first metal layer 503 embedded in the first dielectric layer 502.

The second wafer 60 includes a second substrate 601, a second dielectric layer 602 located on the second substrate 601 and a second metal layer 603 embedded in the second dielectric layer 602. The first dielectric layer 502 faces the second dielectric layer 602, and the two wafers can be bonded by the intermolecular chemical force of a bonding interface film to form a bonding interface 70.

Further, the first dielectric layer 502 includes a first dielectric layer first portion 502a and a first dielectric layer second portion 502b, and the first metal layer 503 is embedded between the first dielectric layer first portion 502a and the first dielectric layer second portion 502b. The second dielectric layer 602 includes a second dielectric layer first portion 602a and a second dielectric layer second portion 602b, and the second metal layer 603 is embedded between the second dielectric layer first portion 602a and the second dielectric layer second portion 602b.

In a preferred embodiment, the first wafer 50 further includes a first etching stopping layer 504, and the first etching stopping layer 504 is located between the first metal layer 503 and the first dielectric layer first portion 502a. The second wafer 60 further includes a second etching stopping layer 604, and the second etching stopping layer 604 is located between the second metal layer 603 and the second dielectric layer second portion 602b.

Further, the second wafer 60 further includes a passivation layer 605 located on the surface of the second dielectric layer second portion 602b. The passivation layer 605 is, for example, a silicon oxide layer and/or a silicon nitride layer to protect the surface of the wafer. In this embodiment, the passivation layer 605 is in contact with the first dielectric layer second portion 502b to form a first bonding interface 70.

Figure 9:
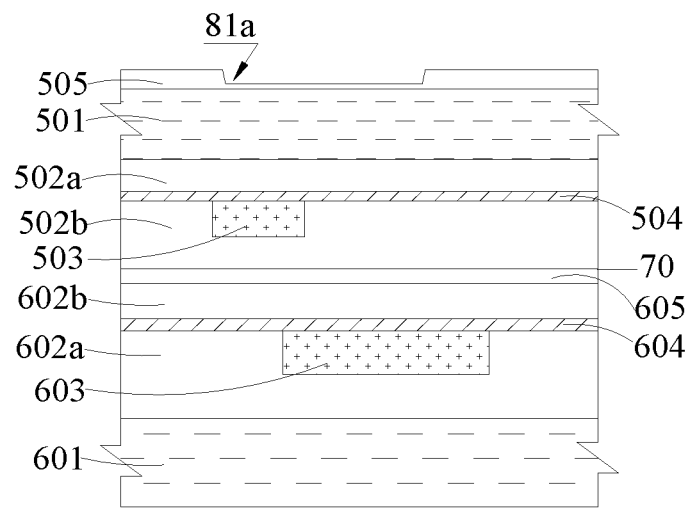
FIG. 9 is a schematic cross-sectional view after a first trench is formed according an embodiment of the present invention.

Next, as shown in FIG. 9, a first trench 81a is formed. First, a thin passivation layer 505 is formed on the back surface of the first substrate 501. The passivation layer 505 is, for example, a silicon oxide layer. Then the passivation layer 505 is etched to form the first trench 81a. The first trench 81a is a shallow trench. The first trench 81a penetrates through a portion of the passivation layer 505 and is located above the first metal layer 503.

Figure 10:
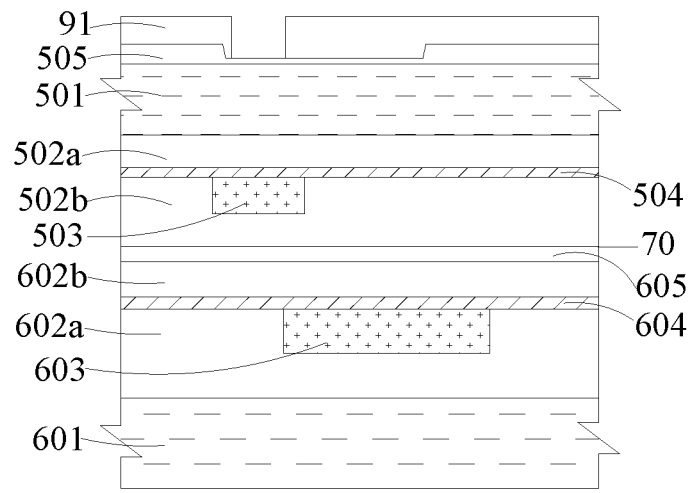
FIG. 10 is a schematic cross-sectional view after a patterned first photoresist is formed according to an embodiment of the present invention.

Next, as shown in FIG. 10, a patterned first photoresist 91 is formed. A first photoresist layer 91 having a good fluidity is used to fill the first trench 81a and cover the surface of the passivation layer 505, and is exposed and developed to form the patterned first photoresist layer 91. The patterned first photoresist layer 91 has a photoresist opening above the first metal layer 503. The first trench 81a is a shallow trench, the first photoresist layer 91 does not need to fill the deep hole, and the first photoresist layer 91 does not need to be thick, thereby reducing the complexity of the photolithography process and improving the exposure effect.

Figure 11:
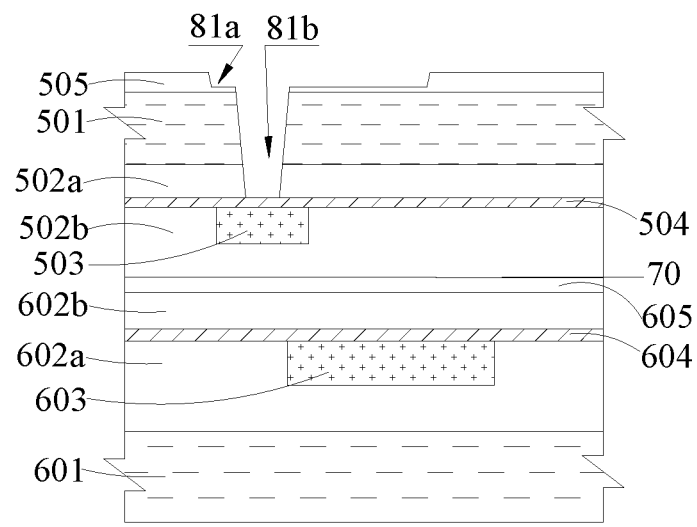
FIG. 11 is a schematic cross-sectional view after a first opening is formed according an embodiment of the present invention.

Next, as shown in FIG. 11, a first opening 81b is formed. Etching is performed by using the patterned first photoresist layer 91 as a mask to form the first opening 81b. The etching stops at the first etching stopping layer 504. The first opening 81b penetrates through the passivation layer 505, the first substrate 501 and the first dielectric layer first portion 502a and is located above the first metal layer 503. Then, the patterned first photoresist layer 91 is removed. The first opening 81b communicates with the first trench 81a.

Figure 12:
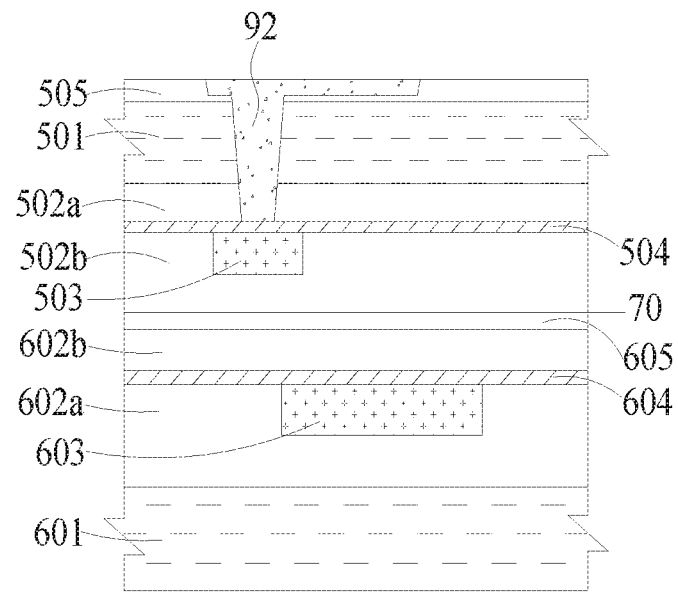
FIG. 12 is a schematic cross-sectional view after a filling layer is formed according to an embodiment of the present invention.

Next, as shown in FIG. 12, a filling layer 92 is formed. The first trench 81a and the first opening 81b are filled with the filling layer 92. The filling layer 92 covers the surface of the passivation layer 505, and the filling layer on the surface of the passivation layer 505 is removed by back etching.

The filling layer 92 is preferably an organic solvent BARC (bottom anti reflective coating) having a good fluidity.

Further, in the present invention, the filling layer is used to fill the first opening 81b (the first opening 81b is a shallow hole), thereby solving the problems that in the TSV nested hole structure, it is difficult to fill the lower opening 41c with the filling layer and it is also difficult to remove the filling layer from the lower opening 41c.

Figure 13:
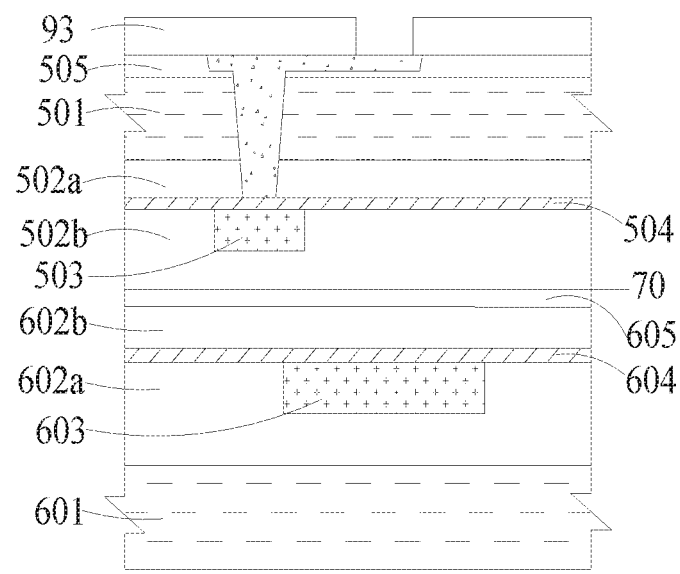
FIG. 13 is a schematic cross-sectional view after a patterned second photoresist is formed according to an embodiment of the present invention.

Next, as shown in FIG. 13, a patterned second photoresist layer 93 is formed. The second photoresist layer 93 is used for coating to cover the surfaces of the passivation layer 505 and the filling layer 92, and a photoresist opening located above the second metal layer 603 is formed by exposure and development. The second photoresist layer 93 does not need fill the deep hole, and the second photoresist layer 93 does not need to be thick, thereby reducing the complexity of the photolithography process and improving the exposure effect.

Figure 14:
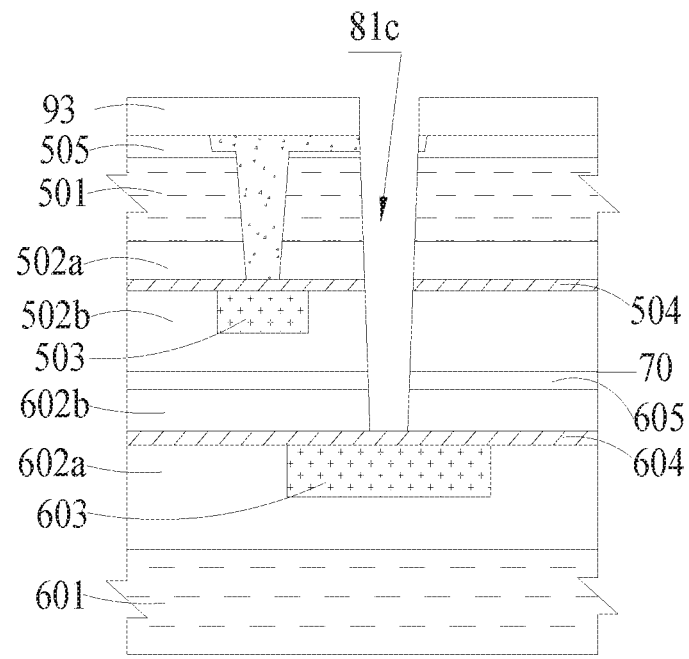
FIG. 14 is a schematic cross-sectional view after a second opening is formed according an embodiment of the present invention.

Next, as shown in FIG. 14, a second opening 81c is formed. Etching is performed by using the patterned second photoresist layer 93 as a mask to form the second opening 81c. The etching stops at the second etching stopping layer 604. The second opening 81c penetrates through the first wafer 50, the passivation layer 605 and the second dielectric layer second portion 602b and is located above the second metal layer 603. The second opening 81c communicates with the first trench 81a. The patterned second photoresist layer 93 and the filling layer 92 are subsequently removed.

Figure 15:
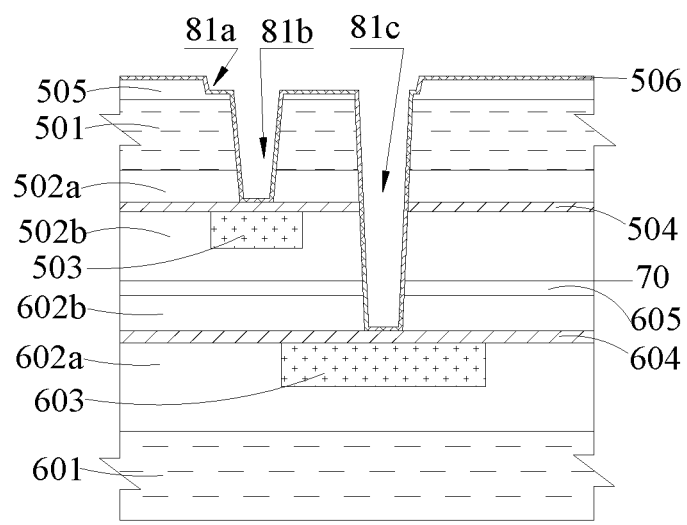
FIG. 15 is a schematic cross-sectional view after an isolation layer is formed according to an embodiment of the present invention.

Next, as shown in FIG. 15, an isolation layer 506 is formed. The isolation layer 506 covering the surface of the passivation layer 505, the surface of the first trench 81a, the surface of the first opening 81b and the surface of the second opening 81c may be formed by selective deposition. The isolation layer 506 is, for example, a silicon oxide layer and a silicon nitride layer which are sequentially stacked to protect the sidewall of the first substrate 501 exposed by the first opening 81b and the second opening 81c in a subsequent process.

Figure 16:
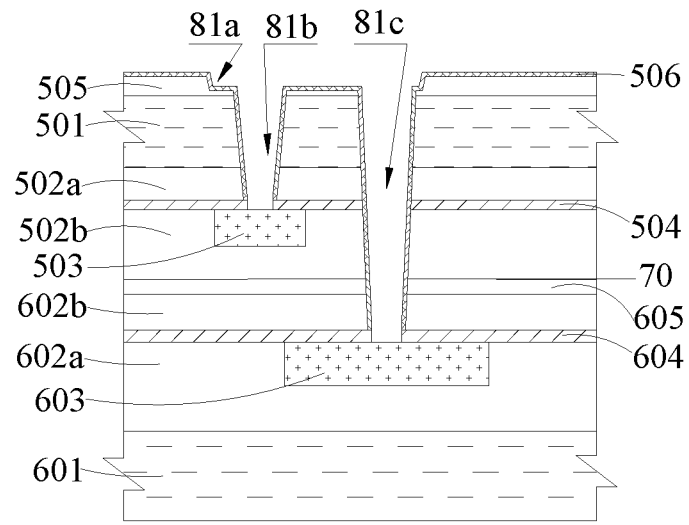
FIG. 16 is a schematic cross-sectional view after a first metal layer and a second metal layer are exposed according to an embodiment of the present invention.

Next, as shown in FIG. 16, a dry etching process is performed. The isolation layer 506 at the bottom of the first opening 81b and a portion of the first etching stopping layer 504 directly below the bottom of the first opening 81b are removed by etching, and the first metal layer 503 is exposed. The isolation layer 506 at the bottom of the second opening 81c and a portion of the second etching stopping layer 604 directly below the bottom of the second opening 81c are removed by etching, and the second metal layer 603 is exposed.

Figure 17:
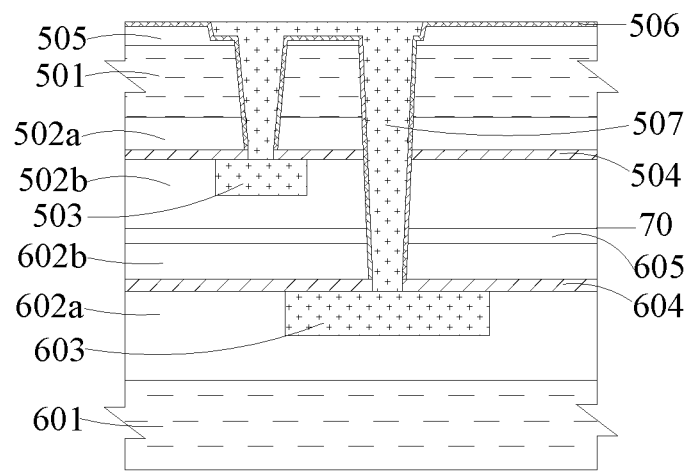
FIG. 17 is a schematic cross-sectional view after an interconnection layer is formed according to an embodiment of the present invention.

Next, as shown in FIG. 17, an interconnection layer 507 is formed. The interconnection layer 507 is electrically connected to the first metal layer 503 and the second metal layer 603 via the first trench 81a, the first opening 81b and the second opening 81c. The interconnection layer 507 is made of a conductive material, which may be copper or a copper alloy. Copper electroplating may be used to fill the first trench 81a, the first opening 81b and the second opening 81c and cover the top isolation layer 506. A portion of the interconnection layer 507 on the surface of the top isolation layer 506 is removed by chemical mechanical polishing.

In the present invention, the first opening 81b communicates with the first trench 81a, the second opening 81c communicates with the first trench 81a, and the interconnection layer 507 is electrically connected to the first metal layer 503 and the second metal layer 603 via the first trench 81a, the first opening 81b and the second opening 81c. The first metal layer 503 and the second metal layer 603 are directly led out via the first trench 81a, so there is no need for the lead-out process of forming an insulating layer and a contact hole in the insulating layer and electrically connecting the lead-out layer to the interconnection layer via the contact hole, thereby simplifying the process and reducing the production cost.

It should be understood that the terms "first", "second", "third", "fourth" and the like are used herein to distinguish different components or techniques having the same name, and do not mean a sequence or a positional relationship or the like. In addition, for different components having the same name, such as "first substrate" and "second substrate", "first dielectric layer" and "second dielectric layer", etc., it does not mean that they have the same structure or components. For example, although not shown in the drawings, in most cases, the components formed in the "first substrate" and the "second substrate" are different, and the structures of the substrates may be different. In some implementations, the substrate may be a semiconductor substrate made of any semiconductor material (e.g., Si, SiC, SiGe, etc.) suitable for a semiconductor device. In other implementations, the substrate may also be a composite substrate such as silicon-on-insulator (SOI), silicon germanium-on-insulator, or the like. Those skilled in the art will understand that the substrate is not subject to any restrictions, but may be selected according to practical applications. Various devices (not limited to semiconductor devices) members (not shown) may be formed in the substrate. The substrate may also have been formed with other layers or members, such as gate structures, contact holes, dielectric layers, metal wires, through holes, and the like.

A semiconductor device according to an embodiment of the present invention, as shown in FIG. 17, includes:

a first wafer 50 and a second wafer 60, wherein the first wafer 50 includes a first substrate 501, a first dielectric layer 502 located on a front surface of the first substrate 501 and a first metal layer 503 embedded in the first dielectric layer 502. The second wafer 60 includes a second substrate 601, a second dielectric layer 602 located on the second substrate 601 and a second metal layer 603 embedded in the second dielectric layer 602. The first dielectric layer 502 faces the second dielectric layer 602;

a passivation layer 505, wherein the passivation layer 505 is located on a back surface of the first substrate 501;

a first trench 81a, wherein the first trench 81a penetrates through a portion of the passivation layer 505 and is located above the first metal layer 503 and the second metal layer 603;

a first opening 81b, wherein the first opening 81b penetrates through the passivation layer 505, the first substrate 501 and a portion of the first dielectric layer 502 and is located above the first metal layer 503, and the first opening 81b communicates with the first trench 81a;

a second opening 81c, wherein the second opening 81c penetrates through the first wafer 50 and a portion of the second dielectric layer 602 and is located above the second metal layer 603, and the second opening 81c communicates with the first trench 81a; and an interconnection layer 507, wherein the interconnection layer 507 is electrically connected to the first metal layer 503 and the second metal layer 603 via the first trench 81a, the first opening 81b and the second opening 81c.

Further, the shape of the cross section of the first opening 81b and the second opening 81c perpendicular to the surfaces of the first wafer and the second wafer is an inverted trapezoid.

According to the semiconductor device provided by the present invention, the first opening penetrates through the passivation layer, the first substrate and a portion of the first dielectric layer and is located above the first metal layer. The second opening penetrates through the first wafer and a portion of the second dielectric layer and is located above the second metal layer. The first opening and the second opening do not communicate with each other. That is, the first opening and the second opening are vertically separated, and are no longer restricted by the condition that the deep upper opening needs to be filled with a thick photoresist when the TSV nested hole in vertical communication forms the middle opening and the lower opening, thereby satisfying the devices with different thicknesses requirements. Meanwhile, the metal layer distribution design of the upper and lower wafers is no longer restricted by the lateral process of the TSV nested hole, thereby enhancing the flexibility of the wafer design.

In addition, although only the electrical connection structure between two metal layers of the semiconductor device is shown in the drawing, those skilled in the art will appreciate that at least one such electrical connection structure between the two metal layers is formed between the two wafers for realizing metal interconnection.

The above description is only for the description of the preferred embodiments of the present invention, and is not intended to limit the scope of the present invention. Any changes and modifications made by those skilled in the art in light of the above disclosure are all within the scope of the appended claims.

What is claimed is:

1. A manufacturing method of a semiconductor device, comprising:
   providing a first wafer and a second wafer, wherein the first wafer comprises a first substrate, a first dielectric layer located on a front surface of the first substrate and a first metal layer embedded in the first dielectric layer, the second wafer comprises a second substrate, a second dielectric layer located on the second substrate and a second metal layer embedded in the second dielectric layer, and the first dielectric layer and the second dielectric layer being bonded to each other;
   forming a first passivation layer, wherein the first passivation layer is located on a back surface of the first substrate;
   forming a first trench, wherein the first trench penetrates through a portion of the first passivation layer and is located above the first metal layer;
   forming a first opening, wherein the first opening penetrates through the first passivation layer, the first substrate and a portion of the first dielectric layer and is located above the first metal layer, and the first opening communicating with the first trench;
   forming a second opening, wherein the second opening penetrates through the first wafer and a portion of the second dielectric layer and is located above the second metal layer, and the second opening communicating with the first trench;
   performing a dry etching process to expose a portion of the first metal layer below the first opening and a portion of the second metal layer below the second opening; and
   forming an interconnection layer, wherein the interconnection layer is electrically connected to the first metal layer and the second metal layer via the first trench, the first opening and the second opening,
   wherein forming the first opening comprises:
   forming a first photoresist layer, wherein the first trench is filled with the first photoresist layer, and the first photoresist layer covering a surface of the first passivation layer;
   performing an exposure and development process to form a patterned first photoresist layer, wherein the patterned first photoresist layer has a photoresist opening located above the first metal layer; and
   etching the first passivation layer, the first substrate and the portion of the first dielectric layer by using the patterned first photoresist layer as a mask to form the first opening.

2. The manufacturing method of a semiconductor device according to claim 1, wherein forming a second opening comprises:
   forming a filling layer, wherein the first trench and the first opening are filled with the filling layer;
   forming a second photoresist layer, wherein the second photoresist layer covers the passivation layer and the filling layer;
   performing an exposure and development process to form a patterned second photoresist layer, wherein the patterned second photoresist layer has a photoresist opening located above the second metal layer; and
   etching the first wafer and of the second dielectric layer by using the patterned second photoresist layer as a mask to form the second opening.

3. The manufacturing method of a semiconductor device according to claim 2, wherein the filling layer is made of an organic solvent of bottom anti reflective coating.

4. The manufacturing method of a semiconductor device according to claim 1, before performing the dry etching process, the manufacturing method further comprising forming an isolation layer, wherein the isolation layer covers a surface of the first passivation layer, a surface of the first trench, a surface of the first opening and a surface of the second opening; and wherein the dry etching process is performed to remove a portion of the isolation layer at a bottom of the first opening and at a bottom of the second opening.

5. The manufacturing method of a semiconductor device according to claim 4, wherein forming the interconnection layer comprises:
   forming an interconnection material, wherein the first trench, the first opening and the second opening are filled with the interconnection material, and the interconnection material covering the isolation layer; and
   performing a chemical mechanical polishing process to remove a portion of the interconnection material on a surface of the isolation layer.

6. The manufacturing method of a semiconductor device according to claim 5, wherein the interconnection layer is made of copper or a copper alloy, and the interconnection layer is formed by an electroplating process.

7. The manufacturing method of a semiconductor device according to claim 1, wherein
   the first dielectric layer comprises a first dielectric layer first portion and a first dielectric layer second portion, and the first metal layer is embedded between the first dielectric layer first portion and the first dielectric layer second portion; the second dielectric layer comprises a second dielectric layer first portion and a second dielectric layer second portion, and the second metal layer is embedded between the second dielectric layer first portion and the second dielectric layer second portion.

8. The manufacturing method of a semiconductor device according to claim 7, wherein the first wafer further comprises a first etching stopping layer, and the first etching stopping layer is located between the first metal layer and the first dielectric layer first portion; the second wafer further comprises a second etching stopping layer, and the second etching stopping layer is located between the second metal layer and the second dielectric layer second portion;
   wherein the dry etching process is performed to remove a portion of the first etching stopping layer at a bottom of the first opening and a portion of the second etching stopping layer at a bottom of the second opening.

9. The manufacturing method of a semiconductor device according to claim 1, further comprising forming the first passivation layer on the back surface of the first substrate, wherein the first passivation layer is a silicon oxide layer.

10. The manufacturing method of a semiconductor device according to claim 7, further comprising forming a second passivation layer on the second dielectric layer second portion, wherein the second passivation layer is a silicon oxide layer and/or a silicon nitride layer.

11. The manufacturing method of a semiconductor device according to claim 1, wherein a shape of a cross section of the first opening perpendicular to a surface of the first wafer is an inverted trapezoid and a shape of a cross section of the second opening perpendicular to a surface of the second wafer is an inverted trapezoid.

* * * * *